United States Patent
Schmid

(10) Patent No.: US 7,813,399 B2
(45) Date of Patent: Oct. 12, 2010

(54) EDGE EMITTING SEMICONDUCTOR LASER COMPRISING A WAVEGUIDE

(75) Inventor: Wolfgang Schmid, Deuerling/Hillohe (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 100 days.

(21) Appl. No.: 12/240,493

(22) Filed: Sep. 29, 2008

(65) Prior Publication Data

US 2009/0147815 A1 Jun. 11, 2009

(30) Foreign Application Priority Data

Sep. 28, 2007 (DE) ........................ 10 2007 046 722
Dec. 7, 2007 (DE) ........................ 10 2007 058 950

(51) Int. Cl.
*H01S 5/00* (2006.01)

(52) U.S. Cl. .............. 372/45.01; 372/43.01; 372/49.01; 372/64

(58) Field of Classification Search .............. 372/43.01, 372/45.01, 49.01
See application file for complete search history.

(56) References Cited

U.S. PATENT DOCUMENTS

| | | | |
|---|---|---|---|
| 4,159,452 A * | 6/1979 | Logan et al. .............. 372/45.01 |
| 4,297,652 A | 10/1981 | Hayashi et al. | |
| 4,742,307 A | 5/1988 | Thylén | |
| 4,757,509 A | 7/1988 | Isshiki et al. | |
| 5,063,173 A | 11/1991 | Gasset et al. | |
| 5,171,707 A | 12/1992 | Takahashi | |
| 5,469,457 A | 11/1995 | Nagai et al. | |
| 5,511,084 A | 4/1996 | Amann | |
| 5,668,049 A | 9/1997 | Chakrabarti et al. | |
| 5,721,750 A | 2/1998 | Kwon et al. | |
| 6,323,052 B1 | 11/2001 | Horie et al. | |
| 7,338,821 B2 | 3/2008 | Ressel et al. | |
| 2005/0094924 A1 | 5/2005 | Forrest et al. | |

FOREIGN PATENT DOCUMENTS

| | | |
|---|---|---|
| DE | 3631971 | 3/1987 |
| DE | 10221952 | 11/2003 |
| EP | 0 332 723 | 9/1989 |
| EP | 0416190 | 3/1991 |
| JP | 2001-350044 | 12/2001 |
| WO | WO 96/11503 | 4/1996 |

OTHER PUBLICATIONS

Karl Joachim Ebeling, "Integrated Optoelectronics", Springer-Verlag, Berlin, Heidelberg, Germany, 1993, pp. 109-115.

* cited by examiner

*Primary Examiner*—Dung T Nguyen
(74) *Attorney, Agent, or Firm*—Cohen Pontani Lieberman & Pavane LLP

(57) ABSTRACT

In an edge emitting semiconductor laser comprising an active layer (3) that generates laser radiation (13) and is embedded into a first waveguide layer (1), wherein the first waveguide layer (1) is arranged between a first cladding layer (4) and a second cladding layer (5) and is delimited by side facets (9) of the semiconductor laser in a lateral direction, a second waveguide layer (2), into which no active layer is embedded, adjoins the second cladding layer (5), the second waveguide layer (2) being optically coupled to the first waveguide layer (1) at least in partial regions (10, 11), and a third cladding layer (6) is arranged at a side of the second waveguide layer (2) that is remote from the first waveguide layer (1).

17 Claims, 2 Drawing Sheets

US 7,813,399 B2

EDGE EMITTING SEMICONDUCTOR LASER COMPRISING A WAVEGUIDE

RELATED APPLICATIONS

This patent application claims the priority of German patent applications 10 2007 046 722.4 filed Sep. 28, 2007 and 10 2007 058 950.8 filed Dec. 7, 2007, the disclosure content of both of which is hereby incorporated by reference.

FIELD OF THE INVENTION

The invention relates to an edge emitting semiconductor laser.

BACKGROUND OF THE INVENTION

In edge emitting semiconductor lasers, at the surfaces of the side facets which form the laser mirrors of the edge emitting semiconductor laser, there is an increased probability of non-radiative recombinations occurring, that is to say that charge carriers recombine to an increased extent in the region of the side facets with generation of heat. The charge carrier depletion that occurs as a result is compensated for by absorption of laser radiation. Since the generation of heat is more intense at the side facet than in the interior of the semiconductor body, the semiconductor is warmer here, whereby the band gap of the semiconductor material is reduced. As a result, non-radiative recombinations are promoted further, which can lead to a further increase in the evolution of heat. At comparatively high laser intensities, an unstable circuit can arise which can lead as far as the melting of the side facet. This possible destruction mechanism is critical for the active layer, in particular, since the adjacent layers generally have a larger band gap and are therefore substantially transparent to the laser radiation.

The document EP 0 416 190 A1 discloses providing the side facets of the semiconductor laser with a passivation layer.

The document U.S. Pat. No. 6,323,052 B1 describes treating the side facets of the semiconductor laser by means of a sputtering process in order to eliminate oxides there that might lead to non-radiative recombinations.

U.S. Pat. No. 5,171,707 describes a method by which transparent regions are produced in the region of the side facets of an edge emitting semiconductor laser by diffusion-induced intermixing, which transparent regions do not absorb the radiation generated by the active layer. A similar method is also known from the document WO 96/11503 A2.

SUMMARY OF THE INVENTION

One object of the present invention is to provide an improved edge emitting semiconductor laser in which the generation of heat in the active layer as a result of non-radiative recombinations at the side facet of the semiconductor laser is reduced.

This and other objects are attained in accordance with one aspect of the present invention directed to an edge emitting semiconductor laser comprising an active layer that generates laser radiation and is embedded into a first waveguide layer, wherein the first waveguide layer is arranged between a first cladding layer and a second cladding layer and adjoins side facets of the semiconductor laser in a lateral direction, a second waveguide layer, into which no active layer is embedded, adjoins the second cladding layer, the second waveguide layer is optically coupled to the first waveguide layer at least in partial regions. A third cladding layer is arranged at a side of the second waveguide layer that is remote from the first waveguide layer.

The edge emitting semiconductor laser therefore contains an active waveguide, which is formed from the first waveguide layer with the active layer embedded therein, and a passive waveguide optically coupled to the first waveguide, said passive waveguide being formed by the second waveguide layer containing no active layer. The fact that the second waveguide layer is optically coupled to the first waveguide layer at least in partial regions is understood in the context of this application to mean that the laser radiation generated in the active layer can, in said partial regions, at least partly couple over from the first waveguide into the second waveguide. Therefore, the laser radiation generated in the active layer of the edge emitting semiconductor laser propagates not only in the first waveguide layer, into which the active layer is embedded, but also in the second waveguide layer at least in partial regions of the semiconductor laser.

Preferably, the first waveguide layer and the second waveguide layer are optically coupled to one another in such a way that, at the side facets of the semiconductor laser, at least part of the laser radiation generated in the active layer propagates in the second waveguide layer. What is advantageously achieved in this way is that the intensity of the laser radiation in the active layer at the side facets is lower than in the case of a conventional edge emitting semiconductor laser that does not contain a second waveguide optically coupled to the first waveguide. Non-radiative recombinations of charge carriers and the associated evolution of heat at the side facet of the semiconductor laser in the region of the active layer are reduced in this way. The second waveguide layer preferably has a larger electronic band gap than the active layer, such that the second waveguide layer is substantially transparent to the laser radiation and, consequently, does not have the problem—described in the introduction—of the absorption of laser radiation on account of charge carrier depletion at the side facet. The risk of damage to the component as a result of a high intensity of the laser radiation at the side facet is therefore lower in the region of the second waveguide layer than in the region of the first waveguide layer containing the active layer.

Preferably, the second waveguide layer is optically coupled to the first waveguide layer in such a way that the laser radiation propagating in the first waveguide layer has an intensity minimum at the side facets of the semiconductor laser.

It should be noted that electromagnetic radiation that propagates in adjacent waveguide layers can at least partly couple over from one waveguide into the other waveguide. It is even possible for the radiation to be completely coupled over if the electromagnetic waves propagate at the same speed in both waveguides.

The principles of the optical coupling of two waveguides are known per se from integrated optoelectronics. The intensity of the coupling of two waveguides is described by the coupling factor $\kappa = \pi/2L_C$, where $L_C$ is the transfer length specifying the length of the coupling path in which the maximum possible overcoupling of the radiation from the first waveguide into the second waveguide takes place. For the case of complete overcoupling, therefore, the transfer length specifies the length of the coupling path in which the radiation completely couples over from the first waveguide into the second waveguide. Complete overcoupling takes place if the phase deviation becomes $\delta = \Delta n \pi/\lambda = 0$, where $\lambda$ is the wavelength of the radiation and $\Delta n$ is the difference in refractive index between the waveguides. The spatial behavior of the waves in coupled waveguides is similar to the temporal behavior of oscillations in a coupled pendulum. A phase deviation δ≠0 corresponds to the case of a different natural frequency of the individual pendulums in which complete energy transfer would not be possible.

In the present case of the at least partly optically coupled waveguide layers, the phase deviation δ and thus the intensity of the optical coupling can be set in particular by the choice of the thickness and the refractive index of the second cladding layer arranged between the waveguide layers and also by the effective refractive indices of the two waveguide layers. By way of example, the second cladding layer can have a constant thickness and a constant refractive index in a lateral direction, wherein the intensity of the coupling between the first waveguide layer and the second waveguide layer is spatially altered by a local variation of the effective refractive index of one of the two waveguide layers.

Here and hereinafter the effective refractive index $n_{eff}$ of a waveguide layer is understood to mean the refractive index which specifies the ratio of the wave number $k_{eff}$ during propagation in the waveguide layer in comparison with vacuum, in other words $k_{eff} = n_{eff} 2\pi/\lambda$. The effective refractive index can deviate from the refractive index of the semiconductor material of the waveguide layer since the laser radiation, during propagation in the waveguide layer, can partly penetrate into the adjacent cladding layers.

The local alteration of the effective refractive index in one of the two waveguide layers defines partial regions in which the waveguides are optically coupled. In order that the first waveguide layer and the second waveguide layer are optically coupled, therefore, the refractive indices of the first and the second waveguide layer and the thickness and the refractive index of the second cladding layer arranged between the waveguide layers are chosen in such a way that the laser radiation generated in the active layer is coupled over from the first waveguide layer into the second waveguide layer at least in partial regions.

In one preferred embodiment, the first waveguide layer and the second waveguide layer are optically coupled in a first partial region and a second partial region, wherein the first partial region and the second partial region adjoin the side facets of the semiconductor laser.

In this embodiment, by way of example, the refractive indices of the first waveguide layer and of the second waveguide layer can deviate from one another in a central region of the semiconductor laser, such that there is no coupling of the waveguide layers in the central region. By contrast, in the region of the side facets of the semiconductor laser, the refractive indices of the first waveguide layer and of the second waveguide layer are adapted to one another in such a way that the laser radiation generated in the active layer embedded into the first waveguide layer can couple over from the first waveguide layer into the second waveguide layer. In this case, therefore, laser radiation is generated in particular by electrically pumping the active layer in the central region of the semiconductor laser, said laser radiation propagating in a lateral direction toward the side facets of the semiconductor laser until it is at least partly coupled over from the first waveguide layer into the second waveguide layer in the partial regions adjoining the side facets of the semiconductor laser.

The widths of the first partial region and of the second partial region are preferably equal to the transfer length, wherein the transfer length is the distance between an intensity maximum and an adjacent intensity minimum within a waveguide layer. The transfer length is therefore equal to the path in which a maximum overcoupling of the laser radiation from the first waveguide layer into the second waveguide layer takes place.

What is advantageously achieved in this way is that, at the side facet of the semiconductor laser, an intensity minimum is present in the first waveguide layer containing the active layer, and an intensity maximum is present in the second waveguide layer.

In a further preferred embodiment, the first waveguide layer and the second waveguide layer are optically coupled in a first partial region and a second partial region, wherein the first partial region and the second partial region are in each case arranged at a distance from a side facet of the semiconductor laser. As in the embodiment described above, the first waveguide layer and the second waveguide layer are not optically coupled in a central region of the semiconductor laser since they have effective refractive indices that deviate from one another, for example. In the first and second partial regions, by contrast, the effective refractive indices of the first waveguide layer and of the second waveguide layer are adapted to one another, such that the laser radiation generated in the active layer can at least partly couple over from the first waveguide layer into the second waveguide layer in said partial regions. The difference with respect to the embodiment described above consists in the fact that the first partial region and the second partial region do not reach as far as the side facet of the semiconductor laser, rather a region in which the waveguide layers are not optically coupled is in each case present between the first partial region and the second partial region and the side facets of the semiconductor laser.

In this embodiment, too, the widths of the first partial region and of the second partial region are preferably equal to the transfer length, that is to say the path length in which the laser radiation maximally couples over from the first waveguide layer to the second waveguide layer. Laser radiation generated by electrical pumping in a central region of the semiconductor laser propagates in a direction of the side facets of the semiconductor laser and is at least partly coupled over into the second waveguide layer in the first partial region and the second partial region in which there is an optical coupling between the first waveguide layer and the second waveguide layer.

Regions which adjoin the side facets of the semiconductor laser and in which no optical coupling is present are arranged outside the first and second partial regions. In these regions, therefore, the intensity of the laser radiation coupled over into the second waveguide layer remains constant in the second waveguide layer, such that the intensity of the laser radiation at the side facets of the semiconductor laser has in each case an intensity maximum in the second waveguide layer and an intensity minimum in the first waveguide layer.

This embodiment has the advantage over the embodiment described above that, during the production of the edge emitting semiconductor laser, the side facets can be produced by severing the semiconductor body in a region in which no optical coupling of the two waveguide layers is present, such that alignment tolerances that possibly occur do not affect the intensity of the overcoupling of the laser radiation from the first waveguide layer into the second waveguide layer. Rather, in this embodiment it is possible to exactly define the widths of the first partial region and of the second partial region by means of photolithography, in order in particular to have the effect that the widths of the first and second partial regions are equal to the transfer length in which maximum overcoupling of the laser radiation takes place.

In the embodiments of the invention described above, the optical coupling of the first and second waveguide layers is preferably effected by adapting the effective refractive index of the first waveguide layer and of the second waveguide layer to one another at least in partial regions. This means that partial regions of the first waveguide layer or of the second waveguide layer in which the first waveguide layer and the second waveguide layer are optically coupled have a different effective refractive index than at least one partial region of the first waveguide layer or second waveguide layer in which no optical coupling is present. By way of example, the second waveguide layer can have a constant effective refractive index in its entire lateral extent, while the effective refractive index in the first waveguide layer has a different value in the partial regions in which an optical coupling is present than in at least one partial region in which no optical coupling of the waveguide layers is present.

As an alternative it is also possible for the first waveguide layer to have a spatially constant effective refractive index, while the second waveguide layer has a different effective refractive index in the partial regions in which an optical coupling of the waveguide layers is intended to be effected than in at least one partial region in which no optical coupling of the waveguide layers is intended to be effected.

The spatial variation of the effective refractive index in at least one of the waveguide layers can be realized for example by virtue of the fact that the partial regions of the first waveguide layer or of the second waveguide layer in which the first waveguide layer and the second waveguide layer are optically coupled have a different dopant and/or a different dopant concentration than the partial regions of the first waveguide layer or second waveguide layer in which no optical coupling of the waveguide layers is present. As an alternative it is also possible for the partial regions of the first waveguide layer or of the second waveguide layer in which the first waveguide layer and the second waveguide layer are optically coupled to be at least partly oxidized. In these methods for the local variation of the effective refractive index in one of the waveguide layers, the positioning and production of the partial regions in which the effective refractive index is altered are effected by methods known per se, for example by application of a mask layer and a subsequent indiffusion or implantation of an additional or of a different dopant or by an oxidation process, for example by a moist-thermal oxidation.

A further possibility for producing an optical coupling in partial regions of the first and second waveguide layers consists in forming a ridge in the semiconductor layer sequence in said partial regions, for example by means of an etching process. In this case, the laser radiation can partly penetrate into the surrounding medium laterally adjoining the ridge, for example a passivation layer. In this way, the effective refractive index changes in a manner similar to how it alters by virtue of the laser radiation partly penetrating into the cladding layers in a vertical direction.

In a further preferred embodiment, the first waveguide layer and the second waveguide layer are optically coupled in their entire lateral extent. For this purpose, the thickness and the refractive index of the second cladding layer arranged between the first waveguide layer and the second waveguide layer and also the effective refractive indices of the first waveguide layer and of the second waveguide layer are advantageously adapted to one another in such a way that the laser radiation generated in the active layer can couple over from the first waveguide layer into the second waveguide layer, and vice versa, over the entire width of the semiconductor laser.

In the resonator formed by the side facets of the semiconductor laser, the laser radiation generated in the active layer forms a standing wave having in this embodiment in a lateral direction at periodically arranged intervals in each case intensity maxima in the first waveguide layer and corresponding intensity minima in the second waveguide layer and intensity minima in the first waveguide layer and corresponding intensity maxima in the second waveguide layer. In the semiconductor laser, therefore, there are periodically arranged regions in which the laser radiation that propagates along the waveguide layers has a high intensity in the first waveguide layer and a low intensity in the second waveguide layer, and interposed regions in which the laser radiation has a high intensity in the second waveguide layer and a low intensity in the first waveguide layer.

Preferably, the standing wave, at the side facets of the semiconductor laser, has in each case an intensity minimum in the first waveguide layer. This means that the laser radiation, in the region of the side facet, propagates substantially or preferably completely in the second waveguide layer, such that the laser radiation at the side facet of the semiconductor laser, in the active layer, has only a low intensity or preferably no intensity at all.

For electrically pumping the active layer of the semiconductor laser, preferably a plurality of contact areas are applied to partial regions of the semiconductor laser in a periodic sequence. In this case, the distance between the contact areas advantageously corresponds to twice the transfer length, wherein the transfer length is the distance between an intensity maximum and an adjacent intensity minimum within one of the waveguide layers. The transfer length thus specifies the distance at which a maximum overcoupling of the laser radiation from the first waveguide layer to the second waveguide layer occurs. Accordingly, twice the transfer length is the distance between two adjacent intensity maxima in the first waveguide layer or the second waveguide layer. By virtue of the fact that the contact areas have the distance of twice the transfer length, two adjacent intensity maxima are excited by electrical pumping in a targeted manner in the active layer. In this case, the distance between the contact areas is understood to mean the distance between the midpoints of the contact areas. In this case, it is advantageous if contact areas which are adjacent to the side facets of the semiconductor laser are arranged at a distance from the side facet of the semiconductor laser which is equal to the transfer length $L_C$ or an odd-numbered multiple of the transfer length $L_C$. In this case, the distance between the contact area and the side facet is understood to mean the distance between the midpoint of the contact area and the side facet. What is achieved in this way is that partial regions of the active layer are electrically pumped which are spaced apart from the side facet by a transfer length or by an odd-numbered multiple of the transfer length. The laser radiation that propagates from these electrically pumped partial regions in the direction of the side facets can couple over into the second waveguide layer maximally and preferably almost completely within the transfer length, such that, at the side facets of the semiconductor laser, in each case there is an intensity minimum present in the active layer and an intensity maximum present in the second waveguide layer.

DETAILED DESCRIPTION OF THE DRAWINGS

Identical or identically acting elements are provided with the same reference symbols in the figures. The figures should not be regarded as true to scale, rather individual elements may be illustrated with an exaggerated size for clarification purposes.

Figure 1:
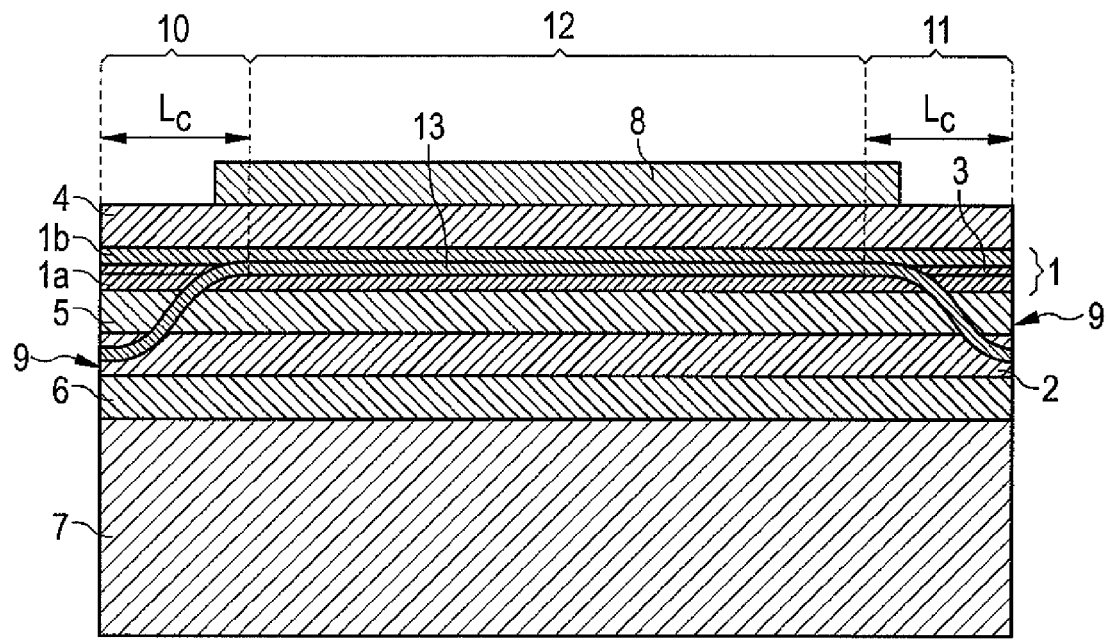
FIG. 1 shows a schematic illustration of a cross section through a first exemplary embodiment of an edge emitting semiconductor laser according to the invention.

The edge emitting semiconductor laser illustrated in FIG. 1 comprises a semiconductor layer sequence containing a first waveguide layer 1, into which an active layer 3 is embedded. The first waveguide layer 1 is composed of a first partial layer 1a and a second partial layer 1b, between which the active layer 3 is arranged. The first waveguide layer 1 is arranged between a first cladding layer 4 and a second cladding layer 5. A second waveguide layer 2, into which no active layer is embedded, adjoins the second cladding layer 5. Furthermore, a third cladding layer 6 is arranged at a side of the second waveguide layer 2 which is remote from the first waveguide layer 1. The semiconductor layer sequence is grown on a substrate 7, for example.

In order to make electrical contact with the semiconductor laser, a contact area 8 is applied to a side of the semiconductor layer sequence that is remote from the substrate 7, which contact area can be for example a contact metallization. In a lateral direction, the semiconductor layer sequence, in particular the first waveguide layer contained therein with the active layer 3 embedded therein, is delimited by side facets 9 of the semiconductor laser. The side facets 9 of the semiconductor laser can be produced in particular by means of severing the semiconductor material.

The first waveguide layer 1 and the second waveguide layer 2 are optically coupled to one another in partial regions 10, 11. This means that laser radiation generated in the active layer 3 can couple over from the first waveguide layer 1 into the second waveguide layer 2 in the partial regions 10, 11.

The intensity of the optical coupling, which determines the proportion of the laser radiation 13 that can couple over from the first waveguide layer 1 into the second waveguide layer 2, depends in particular on the difference between the effective refractive indices $n_1$ of the first waveguide layer 1 and $n_2$ of the second waveguide layer 2. Furthermore, the intensity of the optical coupling of the first waveguide layer 1 to the second waveguide layer 2 depends on the thickness and the refractive index of the second cladding layer 5 arranged between the first waveguide layer 1 and the second waveguide layer 2.

By way of example, in the central region 12 of the semiconductor laser, the effective refractive indices of the first waveguide layer 1 and of the second waveguide layer 2 differ from one another in such a way that the laser radiation 13 generated in the first waveguide layer 1 cannot couple over into the second waveguide layer 2. In this region of the semiconductor laser, therefore, the laser radiation 13 propagates only within the first waveguide layer 1.

In the partial regions 10, 11 adjoining the side facets 9, by contrast, the effective refractive indices of the first waveguide layer 1 and of the second waveguide layer 2 are adapted to one another in such a way that the laser radiation 13 can couple over into the second waveguide layer 2. For this purpose, the waveguide layer 1 has a different effective refractive index in the partial regions 10, 11 than in the central region 12.

The change in the effective refractive index of the first waveguide layer 1 in the partial regions 10, 11 can be effected during the production of the semiconductor laser by virtue of the fact that after the growth of the first waveguide layer 1, in the partial regions 10, 11 the dopant concentration is increased or a further dopant is added. For this purpose, by way of example, a mask is applied to the central region 12 and the additional dopant is implanted or indiffused into the partial regions 10, 11. Another possibility for locally changing the effective refractive index in the partial regions 10, 11 of the first waveguide layer 1 is that said partial regions of the first waveguide layer 1 are oxidized during the production of the semiconductor laser, for example by means of a moist-thermal oxidation.

Preferably, the second waveguide layer 2 is optically coupled to the first waveguide layer 1 in such a way that the laser radiation 13 propagating in the first waveguide layer 1 has an intensity minimum at the side facets 9 of the semiconductor laser. For this purpose, the widths of the first partial region 10 and of the second partial region 11 are chosen such that they are equal to the transfer length $L_C$, wherein the transfer length $L_C$ is the path in which a maximum overcoupling of the laser radiation 13 from the first waveguide layer 1 to the second waveguide layer 2 occurs. If the widths of the first partial region 10 and of the second partial region 11 are smaller than the transfer length $L_C$, only a smaller part than the maximum possible part of the laser radiation 13 is coupled over from the first waveguide layer 1 into the second waveguide layer 2. If the widths of the partial regions 10, 11 are larger than the transfer length $L_C$, the laser radiation 13, proceeding from the central region 12, in the course of its propagation in a direction of the side facets 9, would firstly couple over maximally from the first waveguide layer 1 to the second waveguide layer 2 and, in the region of the path which goes beyond the transfer length $L_C$, would again couple over partly into the first waveguide layer 1. The desired minimization of the intensity of the laser radiation 13 in the region of the active layer 3 at the side facet 9 therefore begins precisely when the widths of the partial regions 10, 11 are equal to the transfer length $L_C$.

The width of the partial regions 10, 11 can be adapted to the transfer length $L_C$ for example by first producing partial regions 10, 11 having an altered effective refractive index in the first waveguide layer, which have a larger width than the transfer length $L_C$, and subsequently producing the laser facets 9 by severing the semiconductor material in a direction perpendicular to the layer planes in such a way that the widths of the partial regions 10, 11 correspond to the transfer length $L_C$.

The contact area 8, for example a contact metallization, is preferably applied to a partial region of the surface of the semiconductor laser which substantially corresponds to the width of the central region 12, in which the first waveguide layer 1 and the second waveguide layer 2 are not optically coupled to one another. In this way, the laser emission in the active layer 3 is advantageously excited by electrical pumping in the partial region 12 of the semiconductor laser in which a maximum intensity in the waveguide layer 1 is desired. In the partial regions 10, 11 in which the laser radiation 13 couples over into the second waveguide layer 2, preferably no laser emission is excited by electrical pumping in the first waveguide layer 1.

Figure 2:
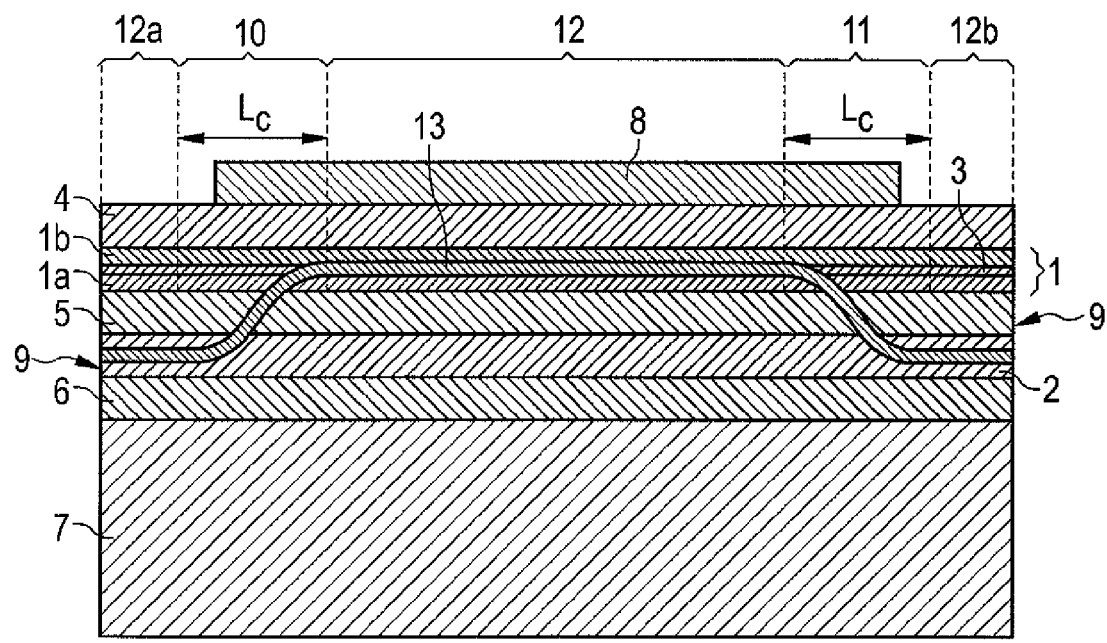
FIG. 2 shows a schematic illustration of a cross section through a second exemplary embodiment of an edge emitting semiconductor laser according to the invention.

The exemplary embodiment of the invention as illustrated in FIG. 2 substantially corresponds to the first exemplary embodiment, but it differs from the first exemplary embodiment in that the partial regions 10, 11 of the first waveguide layer 1 in which the first waveguide layer 1 and the second waveguide layer 2 are optically coupled to one another do not directly adjoin the side facets 9 of the semiconductor laser, but rather are arranged at a distance from a side facet 9 of the semiconductor laser. The semiconductor laser therefore has a central region 12 wherein there is no optical coupling of the first waveguide layer 1 and of the second waveguide layer 2. Toward the outside, that is to say in a direction of the side facets, partial regions 10, 11 in which an optical coupling of the first waveguide layer 1 and of the second waveguide layer 2 is present adjoin the central region 12. Further toward the outside, partial regions 12a, 12b in which once again there is no optical coupling of the first waveguide layer 1 to the second waveguide layer 2 adjoin the partial regions 10, 11. The partial regions 12a, 12b extend as far as the side facets 9 of the semiconductor laser.

As in the first exemplary embodiment, the widths of the partial regions 10, 11 are advantageously equal to the transfer length $L_C$, such that the laser radiation that is generated in the active layer 3 can couple over maximally from the first waveguide layer 1 into the second waveguide layer 2 in the partial regions 10, 11. In the outwardly adjacent partial regions 12a, 12b in which there is no optical coupling of the first waveguide layer 1 and of the second waveguide layer 2, the laser radiation is guided in the second waveguide layer 2 without coupling back into the first waveguide layer. What is advantageously achieved in this way is that an intensity minimum of the laser radiation is present at the side facets 9 of the semiconductor laser in the region of the active layer 3, while it has a maximum intensity in the region of the second waveguide layer at the side facet 9 of the semiconductor laser. The production of the partial regions 10, 11 in which the effective refractive index of the first waveguide layer 1 is adapted to the effective refractive index of the second waveguide layer 2 can be effected as in the first exemplary embodiment for example by a local variation of the doping or by an oxidation of the partial regions 10, 11.

In contrast to the first exemplary embodiment, advantageously both the inner boundary and the outer boundary of the partial regions 10, 11 can be defined comparatively precisely by phototechnological methods, in particular by applying a mask layer to the laterally adjoining regions 12, 12a, 12b of the semiconductor body. In contrast to the first exemplary embodiment, tolerances that possibly occur in the positioning of the separating cuts for producing the side facets 9 of the semiconductor laser do not affect the width of the partial regions 10, 11 in which the first waveguide layer 1 is optically coupled to the second waveguide layer 2. This has the advantage that the widths of the partial regions 10, 11 can be adapted comparatively precisely to the transfer length $L_C$.

Figure 3:
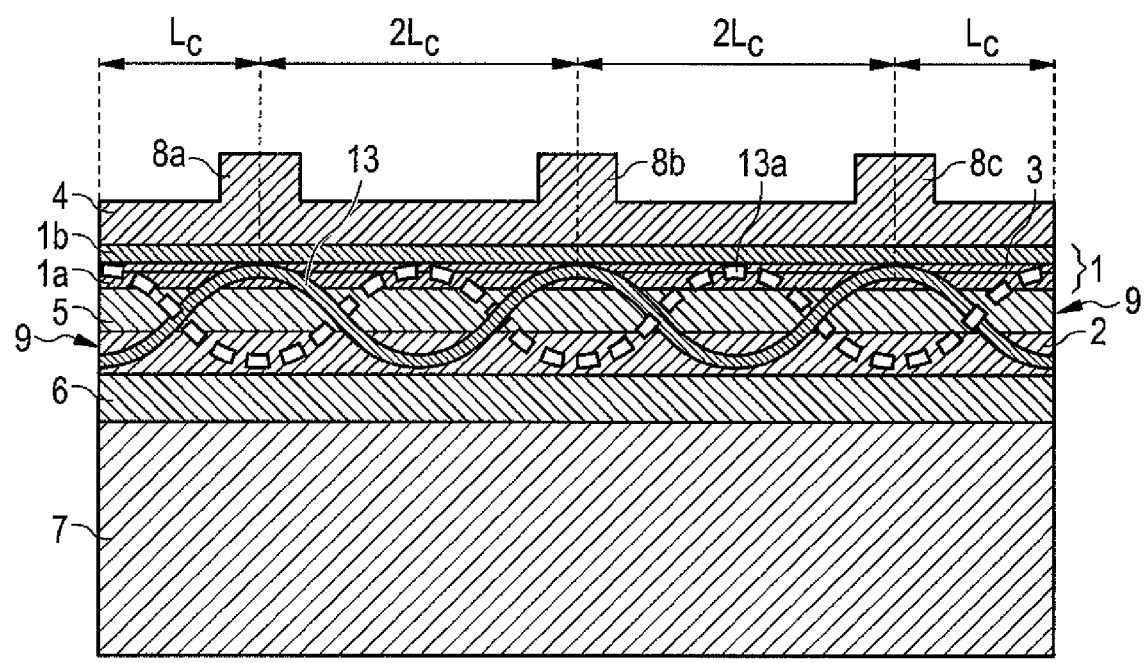
FIG. 3 shows a schematic illustration of a cross section through a third exemplary embodiment of an edge emitting semiconductor laser according to the invention.

The third exemplary embodiment of the invention as illustrated in FIG. 3 differs from the exemplary embodiments described above in that the first waveguide layer 1 and the second waveguide layer 2 are optically coupled to one another in their entire lateral extent. In this case, therefore, the effective refractive indices of the first waveguide layer 1 and of the second waveguide layer 2 are adapted to one another in such a way that the laser radiation 13 generated in the active layer 3 can couple over from the first waveguide layer 1 into the second waveguide layer 2, and vice versa, in the entire width of the semiconductor laser.

In the resonator formed by the laser facets 9, the laser radiation 13 forms a standing wave, such that periodically arranged intensity minima and intensity maxima in each case occur in the first waveguide layer 1 and the second waveguide layer 2. The intensity maxima and intensity minima are in each case spaced apart from one another by the transfer length $L_C$ in the waveguide layers 1, 2. At the locations at which the laser radiation 13 has an intensity maximum in the first waveguide layer 1, it has a corresponding intensity minimum in the second waveguide layer 2, and vice versa.

Preferably, the laser radiation 13, at the side facets 9 of the semiconductor laser, has in each case an intensity minimum in the first waveguide layer 1 containing the active layer 3. At the side facet 9 of the semiconductor laser, therefore, the intensity of the laser radiation 13 is minimal in the first waveguide layer 1 and maximal in the second waveguide layer 2.

For electrically pumping the active layer 3, a plurality of contact areas 8a, 8b, 8c are applied to a surface of the semiconductor layer sequence of the semiconductor laser that lies opposite to the substrate 7, through which contact areas an electrical current can be impressed into partial regions of the active layer 3. By way of example, the substrate 7 can function as second electrical contact, said substrate being electrically conductive in this case.

The midpoints of the contact areas 8a, 8c adjacent to the side facets 9 of the semiconductor laser are preferably spaced apart from the respective side facet 9 in each case by a transfer length $L_C$. What is achieved in this way is that by electrically pumping the active layer 3, an intensity maximum is generated in the first waveguide layer 1 at a distance from the side facet 9 of the semiconductor laser which is equal to the transfer length $L_C$. The laser radiation generated in these regions, in the course of propagation in a direction of the side facets 9, can couple over maximally into the second waveguide layer 2, such that, at the side facet 91 an intensity maximum is present in the second waveguide layer 2 and a corresponding intensity minimum is present in the first waveguide layer 1. This arrangement of the contact areas 8a, 8b, 8c furthermore has the effect that the standing wave 13a, which is illustrated as a dashed line and which would have intensity maxima in the first waveguide layer 1 in the region of the side facets 9, is not excited by electrical pumping. The midpoints of the contact areas 8a, 8b, 8c are spaced apart from one another in each case by twice the transfer length $L_C$ in order to excite the adjacent intensity maxima within the first waveguide layer.

The embodiment of the invention as illustrated in FIG. 3 has the advantage, in particular, that a local variation of the effective refractive index in one of the waveguide layers is not necessary.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

I claim:

1. An edge emitting semiconductor laser comprising:
   an active layer that generates laser radiation and is embedded into a first waveguide layer, wherein the first waveguide layer is arranged between a first cladding layer and a second cladding layer and adjoins side facets of the semiconductor laser in a lateral direction;
   a second waveguide layer, into which no active layer is embedded, adjoining the second cladding layer, wherein the second waveguide layer is optically coupled to the first waveguide layer at least in partial regions; and
   a third cladding layer arranged at a side of the second waveguide layer that is remote from the first waveguide layer;
   wherein the partial regions of the first waveguide layer or of the second waveguide layer in which the first waveguide layer and the second waveguide layer are optically coupled have a different effective refractive index than at least one partial region of the first waveguide layer or second waveguide layer in which no optical coupling is present.

2. The edge emitting semiconductor laser as claimed in claim 1, wherein the second waveguide layer is optically coupled to the first waveguide layer in such a way that, at the side facets of the semiconductor laser, at least part of the laser radiation generated in the active layer propagates in the second waveguide layer.

3. The edge emitting semiconductor laser as claimed in claim 2, wherein the second waveguide layer is optically coupled to the first waveguide layer in such a way that the laser radiation propagating in the first waveguide layer has an intensity minimum at the side facets of the semiconductor laser.

4. The edge emitting semiconductor laser as claimed in claim 1, wherein the first waveguide layer and the second waveguide layer are optically coupled in a first partial region and a second partial region, wherein the first partial region and the second partial region adjoin the side facets of the semiconductor laser.

5. The edge emitting semiconductor laser as claimed in claim 1, wherein the first waveguide layer and the second waveguide layer are optically coupled in a first partial region and a second partial region, wherein the first partial region and the second partial region are in each case arranged at a distance from a side facet of the semiconductor laser.

6. The edge emitting semiconductor laser as claimed in claim 1, wherein the partial regions of the first waveguide layer or of the second waveguide layer in which the first waveguide layer and the second waveguide layer are optically coupled have a different dopant and/or a different dopant concentration than at least one partial region of the first waveguide layer or second waveguide layer in which no optical coupling is present.

7. The edge emitting semiconductor laser as claimed in claim 1, wherein the partial regions of the first waveguide layer or of the second waveguide layer in which the first waveguide layer and the second waveguide layer are optically coupled are at least partly oxidized.

8. The edge emitting semiconductor laser as claimed in claim 1, wherein a ridge is formed in the partial regions of the first waveguide layer or of the second waveguide layer in which the first waveguide layer and the second waveguide layer are optically coupled.

9. The edge emitting semiconductor laser as claimed in claim 1, wherein the first waveguide layer and the second waveguide layer are optically coupled to one another along their entire lateral extent.

10. An edge emitting semiconductor laser comprising:
   an active layer that generates laser radiation and is embedded into a first waveguide layer, the first waveguide layer being arranged between a first cladding layer and a second cladding layer and adjoining side facets of the semiconductor laser in a lateral direction;
   a second waveguide layer, into which no active layer is embedded, adjoining the second cladding layer, the second waveguide layer being optically coupled to the first waveguide layer at least in partial regions; and
   a third cladding layer arranged at a side of the second waveguide layer remote from the first waveguide layer;
   wherein the first waveguide layer and the second waveguide layer are optically coupled in a first partial region and a second partial region; and
   wherein the first partial region and the second partial region adjoin the side facets of the semiconductor laser.

11. The edge emitting semiconductor laser as claimed in claim 10, wherein the widths of the first partial region and of the second partial region are equal to the transfer length, wherein the transfer length is the distance between an intensity maximum and an adjacent intensity minimum within one of the waveguide layers.

12. An edge emitting semiconductor laser comprising:
   an active layer that generates laser radiation and is embedded into a first waveguide layer, the first waveguide layer being arranged between a first cladding layer and a second cladding layer and adjoining side facets of the semiconductor laser in a lateral direction;
   a second waveguide layer, into which no active layer is embedded, adjoining the second cladding layer, the second waveguide layer being optically coupled to the first waveguide layer at least in partial regions; and
   a third cladding layer arranged at a side of the second waveguide layer remote from the first waveguide layer;
   wherein the first waveguide layer and the second waveguide layer are optically coupled to one another along their entire lateral extent.

13. The edge emitting semiconductor laser as claimed in claim 12, wherein the laser radiation generated in the active layer forms a standing wave having in a lateral direction at periodic intervals in each case intensity maxima in the first waveguide layer and corresponding intensity minima in the second waveguide layer and intensity minima in the first waveguide layer and corresponding intensity maxima in the second waveguide layer.

14. The edge emitting semiconductor laser as claimed in claim 13, wherein the standing wave, at the side facets of the semiconductor laser, has in each case an intensity minimum in the first waveguide layer.

15. The edge emitting semiconductor laser as claimed in claim 12, wherein a plurality of contact areas are applied to partial regions of the semiconductor laser at periodic distances.

16. The edge emitting semiconductor laser as claimed in claim 15, wherein the distance between the contact areas is equal to twice the transfer length, wherein the transfer length is the distance between an intensity maximum and an adjacent intensity minimum within one of the waveguide layers.

17. The edge emitting semiconductor laser as claimed in claim 15, wherein a contact area is in each case arranged at a distance from the side facet of the semiconductor laser which is equal to the transfer length or to an odd-numbered multiple of the transfer length.

* * * * *